United States Patent [19]
Stengel et al.

[11] Patent Number: 5,901,346
[45] Date of Patent: May 4, 1999

[54] METHOD AND APPARATUS UTILIZING A COMPENSATED MULTIPLE OUTPUT SIGNAL SOURCE

[75] Inventors: Robert E. Stengel, Pompano Beach; Scott A. Olson, Davie, both of Fla.

[73] Assignee: Motorola, Inc., Schaumburg, Ill.

[21] Appl. No.: 08/773,798

[22] Filed: Dec. 17, 1996

Related U.S. Application Data

[63] Continuation-in-part of application No. 08/764,411, Dec. 11, 1996, abandoned.

[51] Int. Cl.$^6$ ........................................................ H04B 1/04
[52] U.S. Cl. ............................................. 455/126; 330/129
[58] Field of Search ................................ 455/91, 95, 115, 455/116, 117, 126, 127; 330/109, 129, 149, 126 R; 375/295, 296

[56] References Cited

U.S. PATENT DOCUMENTS

| | | | |
|---|---|---|---|
| 5,105,168 | 4/1992 | DaSilva | 331/2 |
| 5,264,807 | 11/1993 | Okubo et al. | 330/295 |
| 5,287,069 | 2/1994 | Okubo et al. | 330/10 |
| 5,339,054 | 8/1994 | Taguchi | 332/100 |
| 5,423,082 | 6/1995 | Cygan et al. | 455/126 |
| 5,574,992 | 11/1996 | Cygan et al. | 455/126 |

OTHER PUBLICATIONS

Sudstrom, L., "Automatic adjustment of gain and phase imbalances in LINC transmitters," Electronics Letters, vol. 31, No. 3, Feb. 2,1995, pp. 155–156.

Cox, D.C., "Linear Amplification with Nonlinear Components," Institute of Electrical and Electronics Engineers Transactions on Communications, Dec. 1974, pp. 1942–1945.

Hetzel, S.A., A. Bateman and J.P. McGeehan, "A LINC Transmitter," Institute of Electrical and Electronics Engineers, Inc., 1991, pp. 133–137.

Chan, Kam–yuen and Andrew Bateman, "Linear Modulators Based on RF Synthesis: Realization and Analysis," Institute of Electrical and Electronics Engineers, Inc., 1995, pp. 321–333.

*Primary Examiner*—Thanh Cong Le
*Attorney, Agent, or Firm*—Andrew S. Fuller

[57] ABSTRACT

A compensated signal source (210, 220) utilizes baseband signals and a radio frequency carrier signal to generate a set of source output signals (226, 227) which are coupled to a particular circuit (230, 240, 250). The signal source (210, 220) is operable in a characterizing mode in which a test configuration is applied, and outputs from the signal source and the particular circuit measured to develop parameters representing imperfections within the signal source and within the particular circuit. The signal source (210, 220) is operable in a normal mode, in which compensation based on the measured parameters is applied to account for the imperfections. In a preferred embodiment, the particular circuit (230, 240, 250) and compensated signal source (210, 220) form part of an amplifier (200) that implements linear amplification using nonlinear components (LINC) techniques.

25 Claims, 7 Drawing Sheets

METHOD AND APPARATUS UTILIZING A COMPENSATED MULTIPLE OUTPUT SIGNAL SOURCE

CROSS REFERENCE TO RELATED APPLICATIONS

This application is a continuation-in-part of pending U.S. application Ser. No. 08/764,441, filed Dec. 11, 1996, abandoned.

TECHNICAL FIELD

This invention relates in general to signal processing circuits requiring known relationships between multiple signal paths, such as amplification circuits requiring phase and amplitude balance between amplification paths.

BACKGROUND OF THE INVENTION

Many signal processing circuits have a need to maintain known relationships between the signals traversing multiple signal paths. In practice, however, imperfections within a circuit can affect such relationships and adversely impact the performance of the circuit. One important example is that of an amplifier employing a linear amplification using nonlinear components (LINC) technique. In a typical LINC amplifier, a signal to be amplified is decomposed into two channel signals, both having an equal and constant envelope. It is known to use baseband inphase (I) and quadrature (Q) signal modulation of a radio frequency (RF) carrier signal to obtain the two channel signals. The decomposed signals are separately amplified then combined to form a linearly amplified signal. The LINC amplifier is attractive because the signals to be amplified have a constant envelope thereby enabling the use of efficient nonlinear radio frequency (RF) power amplifiers for amplification. As both signals are required to have equal amplitudes and proper phase relationships, it is important that the phase and gain for signal processing within each amplification path be balanced.

The promise of LINC amplifiers have yet to be fully realized in part because of the difficulty in developing circuits that maintain phase and gain balance for signals amplified using the separate amplification paths. For example, it may be desirable to achieve a level of amplitude signal accuracy of −65dBc for adjacent channel coupled power, and phase and gain resolution of within 0.5% for signals traversing the different amplification paths. Manufacturing imperfections within the amplification circuits make such balancing requirements difficult to achieve.

The prior art describes a variety of approaches to address such circuit imperfections. In one approach, phase and power measurements are made of RF signals and such measurements used to adjust for signal path imbalance. Adjustments typically involve phase and amplitude corrections along the RF signal path. Generally, phase measurements and adjustments tend to be complex and difficult to implement with extreme precision. In another prior art approach, a feedback loop is used which requires the sampling and processing of the RF signal to compare with the original baseband I and Q signals. This approach typically requires complex stability analysis to handle impedance load variations and other factors.

It is desirable to accommodate differences in circuits due to component imperfections and operating environment which can lead to unwanted variations in signal processing. This would enable implementation of LINC amplifiers and other circuits requiring the maintenance of a precise relationship between signals processed in different portions of a circuit. Therefore, a new approach to compensation for circuit imperfections is needed.

BRIEF DESCRIPTION OF THE DRAWINGS

FIG. 4 is a graph showing the relationship between channel quadrature phase imbalance and combined voltage of the channel quadrature signals in a LINC amplifier, in.

DETAILED DESCRIPTION OF THE PREFERRED EMBODIMENT

The present invention provides for the utilization of a compensated signal source to correct for imperfections within a particular circuit. This approach is particularly useful in circuits requiring the maintenance of a known relationship between signals traversing multiple signal paths. The linear amplification using nonlinear components (LINC) amplifier is one such example. Preferably, the compensated signal source utilizes baseband signals and a radio frequency (RF) carrier signal to generate a set of source output signals which are coupled to the particular circuit in an open loop configuration. The signal source is operable in a characterizing mode which allows application of a training or test configurational designed to highlight imperfections within the signal source and within the particular circuit. During application of the training configuration, the source output signals and one or more outputs from the particular circuit are measured to develop parameters representing the imperfections. The signal source is operable in a normal mode in which compensation based on the measured parameters is applied to account for the imperfections. Preferably, compensation is applied, at least in part, by manipulation of the baseband signals.

Figure 1:
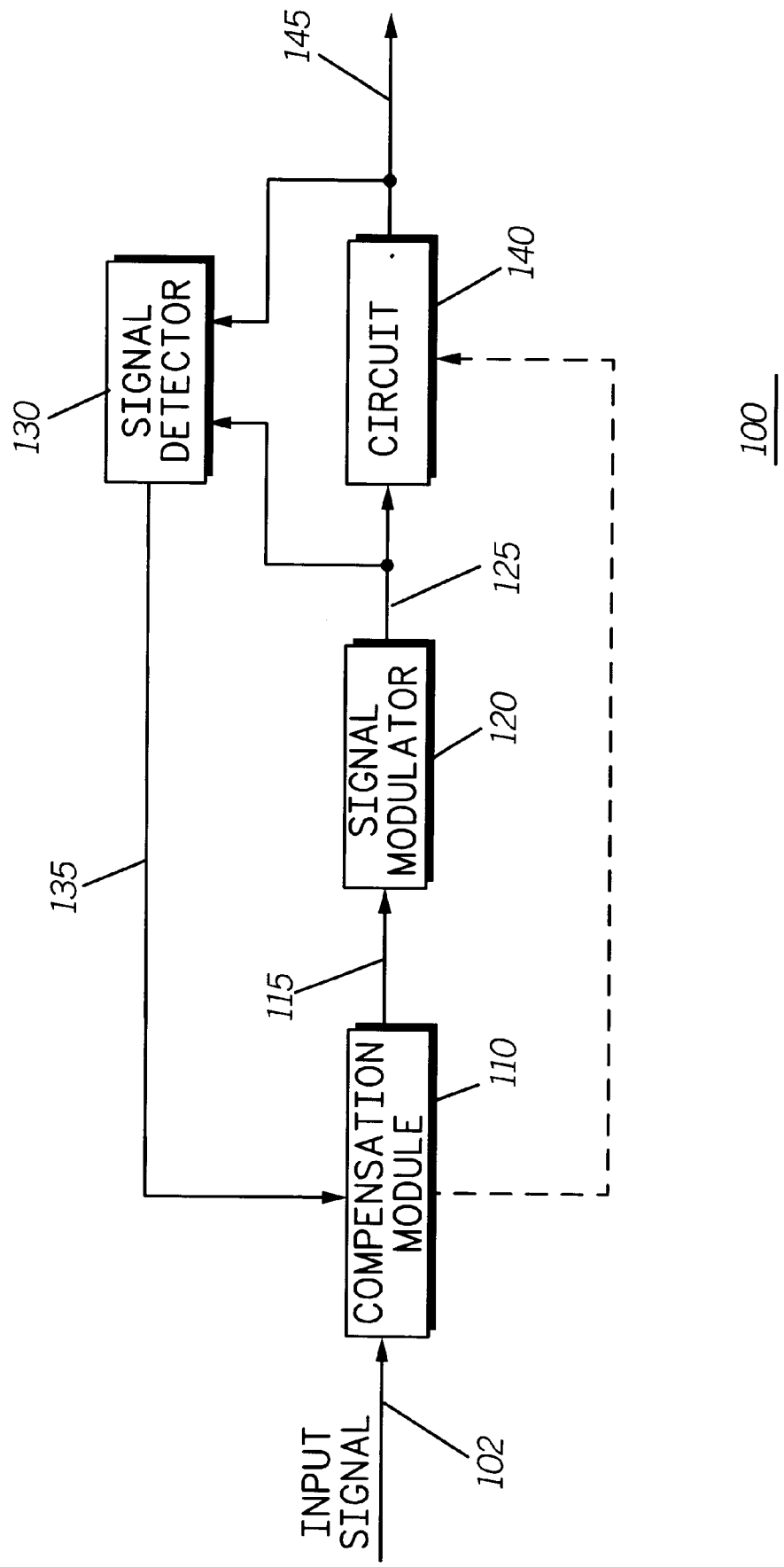
FIG. 1 is a block diagram of a circuit apparatus that utilizes a compensated signal source, in accordance with the present invention.

FIG. 1 is a simplified block diagram depicting a generic compensated circuit apparatus 100, in accordance with the present invention. The compensated circuit apparatus 100 includes a compensation module 110, a signal modulator 120, a signal detector 130, and an application circuit 140. The compensation module 110 and the signal modulator 120 together form a compensated signal source. The circuit apparatus 100 is operable in a configuration or characterizing mode in which imperfections within the circuit apparatus are characterized. The circuit apparatus 100 is alternatively operable in a normal operating or application mode in which an input signal 102 is processed to produce an output signal 145. In the characterizing mode, the signal detector 130 measures signals 125, which are sourced from the signal modulator 120 and coupled to the circuit 140, and measures signals 145 which are output from the circuit 140. The signal detector 130 has an output 135 that is coupled to the compensation module 110. The output 135 of the signal detector 130 is used to develop parameters according to an error model representing the possible imperfections within the circuit apparatus 100. In the normal operating mode, compensation values developed during the characterizing mode are applied when processing the input signal 102, and compensated signals 115 are applied to the signal modulator 120. The compensation module 110 may also be used to directly control the circuit 140 depending on the particular application.

Figure 2:
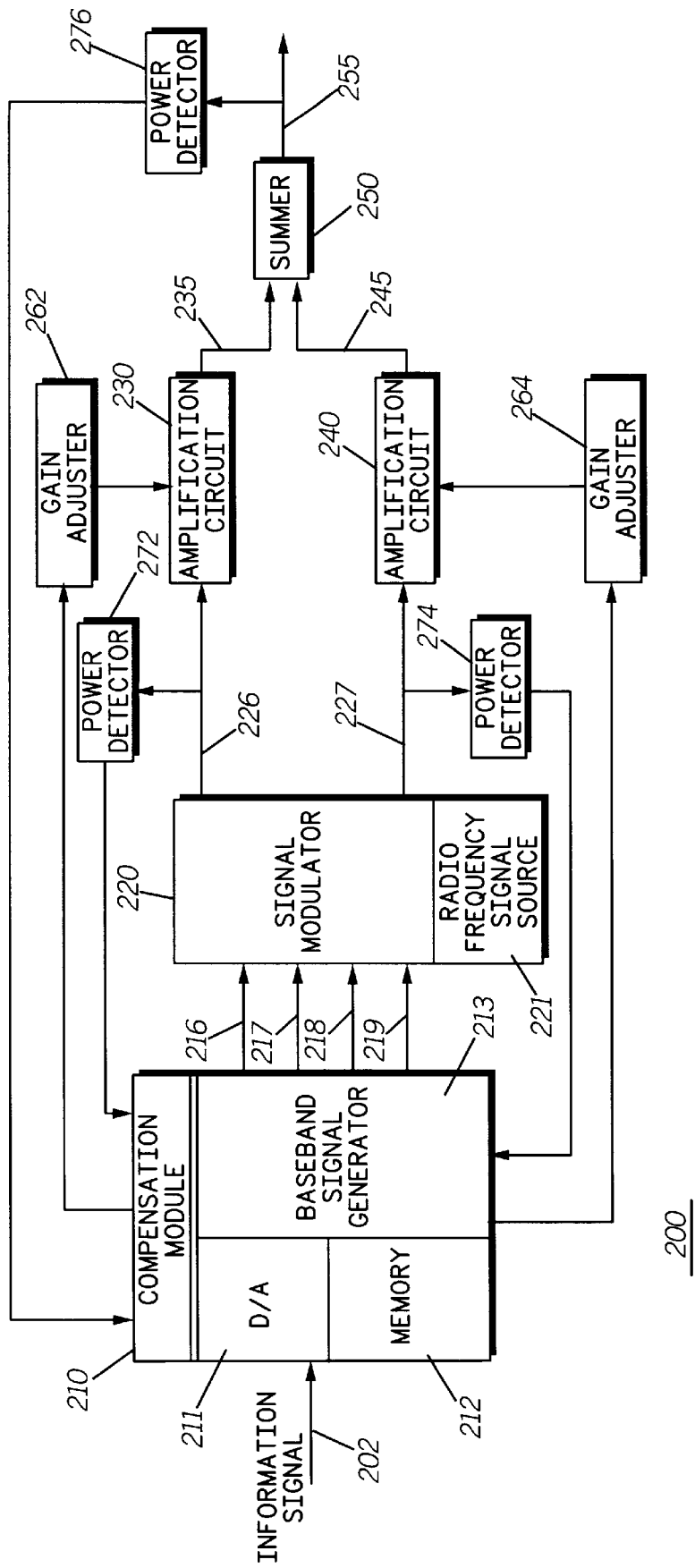
FIG. 2 is a block diagram of a LINC amplifier utilizing circuit compensation, in accordance with the present invention.

FIG. 2 is a block diagram of a LINC amplifier circuit 200 that processes an input information signal 202 to generate an amplifier output signal 255, in accordance with the present invention. The LINC amplifier circuit 200 utilizes a compensated signal source formed by compensation module 210 and signal modulator 220 to compensate for circuit imperfections in an open loop configuration. The compensation module 210 includes a digital to analog (D/A) converter 211, a memory 212, and a baseband signal generator 213. The compensation module 210 inputs the information signal 202 and outputs a set of baseband signals 216, 217, 218, 219, which are coupled to the signal modulator 220. The signal modulator 220 utilizes the baseband signals 216, 217, 218, 219, and a radio frequency signal source 221 to generate two RF source signals 226, 227, both having an equal and constant envelope. The RF source signals 226, 227 form input signals to a pair of amplification circuits 230, 240. The amplification circuits 230, 240 are designed to independently amplify the respective RF source input signals 226, 227 in a like manner to generate outputs of amplified signals 235, 245. Preferably, phase and amplitude relationships are maintained between the amplified signals 235, 245 and the input signals 226, 227. Accordingly, it is important that the amplification circuits 230, 240, have circuitry with gain and phase balance, to process their respective input signals which have an equal and constant envelope. The amplified signals 235, 245 are combined by a summer or combiner 250 to produce the amplifier output signal 255.

For imperfection characterization purposes, the amplifier circuit 200 has a signal detector, which in the preferred embodiment, constitutes power detectors 272, 274, 276. The power detectors 272, 274, 276 are coupled to the RF source signals 226, 227, and to the amplified signal 255, respectively, and are selectively operated to detect the respective signal levels. The power detectors 272, 274, 276 are coupled to the compensation module 210 to provide signal level information. For compensation purposes, the amplifier circuit 200 includes gain adjusters 262, 264, which are coupled to the amplification circuits 230, 240, respectively. The gain adjusters 262, 264 are coupled to the compensation module which provide operational control.

The LINC amplifier 200 is operable in a characterizing mode or in a normal operating mode. When operating in the characterizing mode, a training configuration is applied to the signal source 210, 220 to highlight imperfections within the signal source 210, 220 within the amplification circuits 230, 240, and summer 250. Preferably, the training configuration is applied by manipulating the baseband signal inputs to generate predefined test conditions. The power detectors 272, 274, 276 are used to measure the signal levels at the inputs to the amplification circuit 230, 240 and at the output 255 representing the amplified signal. The compensation module 210 develops parameters for an error model representing imperfections within the amplifier circuit 200. The power level measurements are used to derive amplitude and phase correction values which are stored in memory 212. In effect, data is generated characterizing amplitude and phase imbalances between the amplification paths represented by the amplification circuits 230, 240, and imperfections within the signal source 210, 220.

When the LINC amplifier operates in the normal operation mode, the compensation module processes the information signal 202 to generate baseband input signals, which are modified to apply compensation for amplitude and phase imbalance signal processing within the signal source 210, 220, the amplification circuits 230, 240, and the summer 250.

Figure 3:
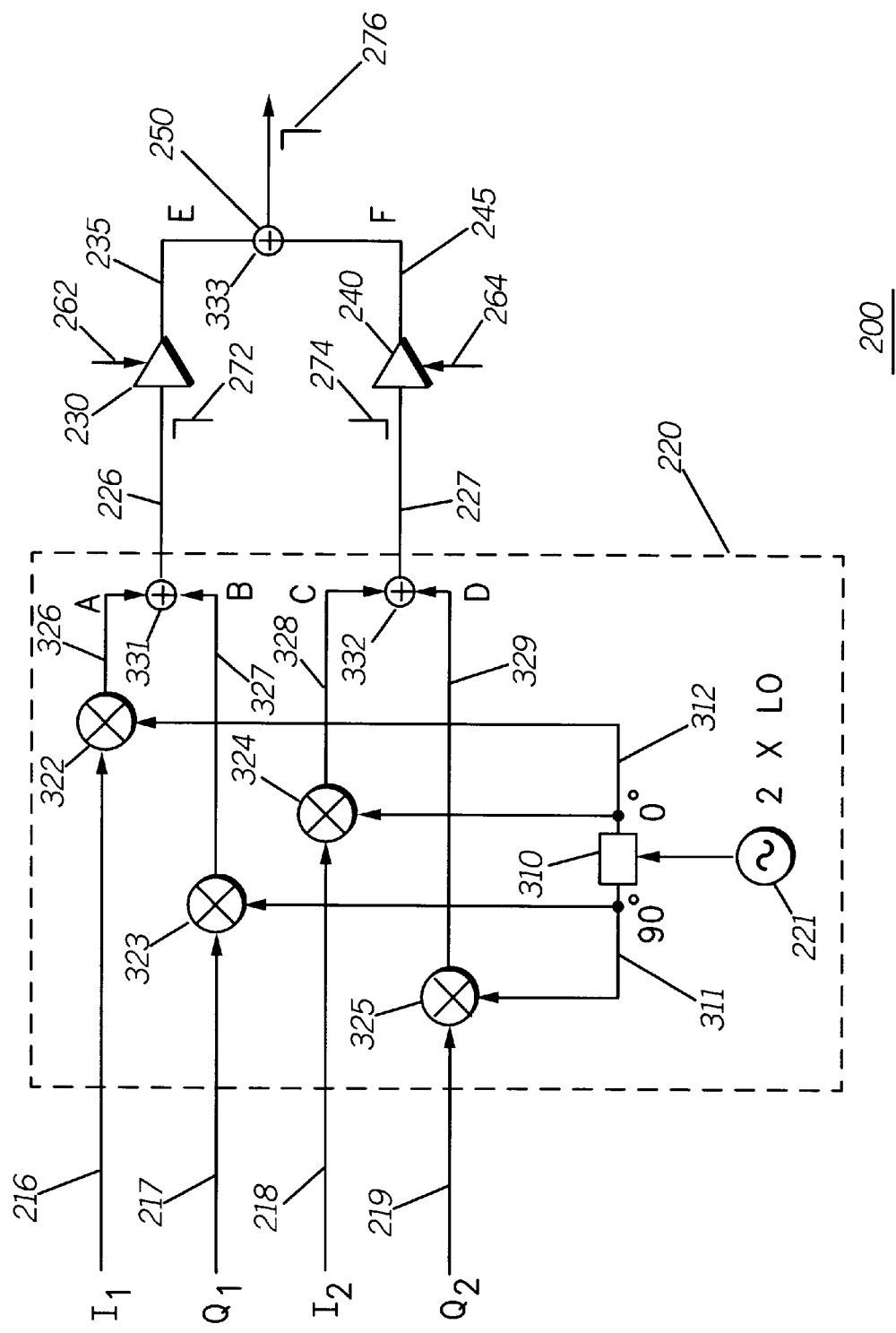
FIG. 3 is a circuit diagram of portions of the LINC amplifier of FIG. 2, highlighting imbalance contributors associated with a Cartesian LINC system, in accordance with the present invention.

FIG. 3 is a circuit diagram highlighting portions of the LINC amplifier circuit 200 from which parameters for an error model characterizing circuit imperfections is developed. In an implementation of the signal modulator 220 using Cartesian RF signal processing, baseband signals 216, 217, 218, 219, are used to modulate a signal from an RF source 221 to generate source or channel signals 226, 227. A signal splitter 310 splits the RF signals from the RF source 221, operating at twice the local oscillator frequency (2×LO) into signal components (LO$_1$, LO$_2$) 311, 312, which have equal amplitude, and which have 90 degrees of phase difference. Baseband signals 216, 217 representing the inphase (I$_1$) and quadrature (Q$_1$) components are mixed with RF carrier signals LO$_2$, LO$_1$ at mixers 322, 323. The resultant mixed signals 326, 327 are inputted to a summer 331 which outputs the channel signal 226. Similarly, baseband signals 218, 219 form inphase (I$_2$) and quadrature (Q$_2$) components which are mixed with RF carrier signals LO$_2$, LO$_1$ at mixers 324, 325. The resultant mixed signals 328, 329 are inputted to a summer 332 which outputs the channel signal 227.

A quadrature balance error occurs when the product of I$_1$ and LO$_2$ does not have equal amplitude and exactly 90 degrees of phase difference relative to the product Q$_1$ and LO$_1$. Channel imbalance occurs when the output signals E, F, from the amplifiers 230, 240, respectively, do not have the same amplitude and phase shift relationships as the amplifiers input signals 226, 227 due to imbalances between the amplifiers 230, 240. Knowledge of the sources of imbalance can be utilized to derive a set of equations that describe the relationships between the gain and phase imbalance relative to the various summer input signals. Thus, signal parameters A, B, C, D, E, and F, from which circuit imperfection characterization can occur, are identified at the inputs of summers 331, 332, and at the inputs of summer 250. From the depicted circuit configuration the relative gain and phase imbalance can be derived from the following equations:

$$A = \cos(\omega_{LO}(t))$$

$$B = G_1 \sin(\omega_{LO}(t) + \phi_1)$$

$$C = \cos(\omega_{LO}(t))$$

$$D = G_2 \sin(\omega_{LO}(t) + \phi_2)$$

$$E = (A+B)G_A$$

$$F = G[\cos(\omega_{LO})(t) + \theta) + G_2 \sin(\omega_{LO}(t) + \phi_2 + \theta)]$$

In the above equations, $\omega_{LO}$ is half the frequency associated with the local oscillator, and $G_A$ is the gain of amplifier 230. $G_1$ and $\phi_1$ represent the gain and phase imbalance of signal B relative to signal A. $G_2$ and $\phi_2$ represent the gain and phase imbalance of signal C relative to signal D. G and θ represent the channel gain and phase imbalance of signal F relative to signal E. Using these relationships as an error model, a characterization or calibration process can be used to aid in compensating for imbalances.

In the characterization process of the preferred embodiment, a first test condition is established where $I_1$ is applied at its expected peak value, and the power setting of the power amplifier 230 adjusted for a desired output level. Similarly, $I_2$ is applied at its peak expected level, and the power setting of power amplifier 240 adjusted for the desired power level. Thus, gain imbalance G has been accounted for with the independent power setting of the power amplifiers 230, 240. It is desirable that signal A and B have equal amplitudes, and that signal C and D have equal amplitudes. To achieve these amplitude conditions, $Q_1$ is applied with a value of 1 and a multiplication factor of $G_1$ is adjusted to achieve a desired output power, as determined by power detector 272, equal to that when $I_1$ is applied with a value of 1 and $Q_2$ is set to zero. The amplitude set in the previous procedures are repeated for signal $Q_2$ and multiplication factor $G_2$ relative to signal $I_2$. At this point, the factors G, $G_1$ and $G_2$ are determined, and the output power should be at the desired level when any of the four signals $I_1$, $Q_1$, $I_2$, and $Q_2$ are applied at a value of 1 with G, $G_1$ and $G_2$ compensation. Once phase imbalance has been accounted for, combinations of I and Q signals with levels to maintain an amplitude of 1, will also have a constant output power. Signals A and C are the inphase reference terms for each channel, and are used to determine the channel phase imbalance term 0.

Figure 4:
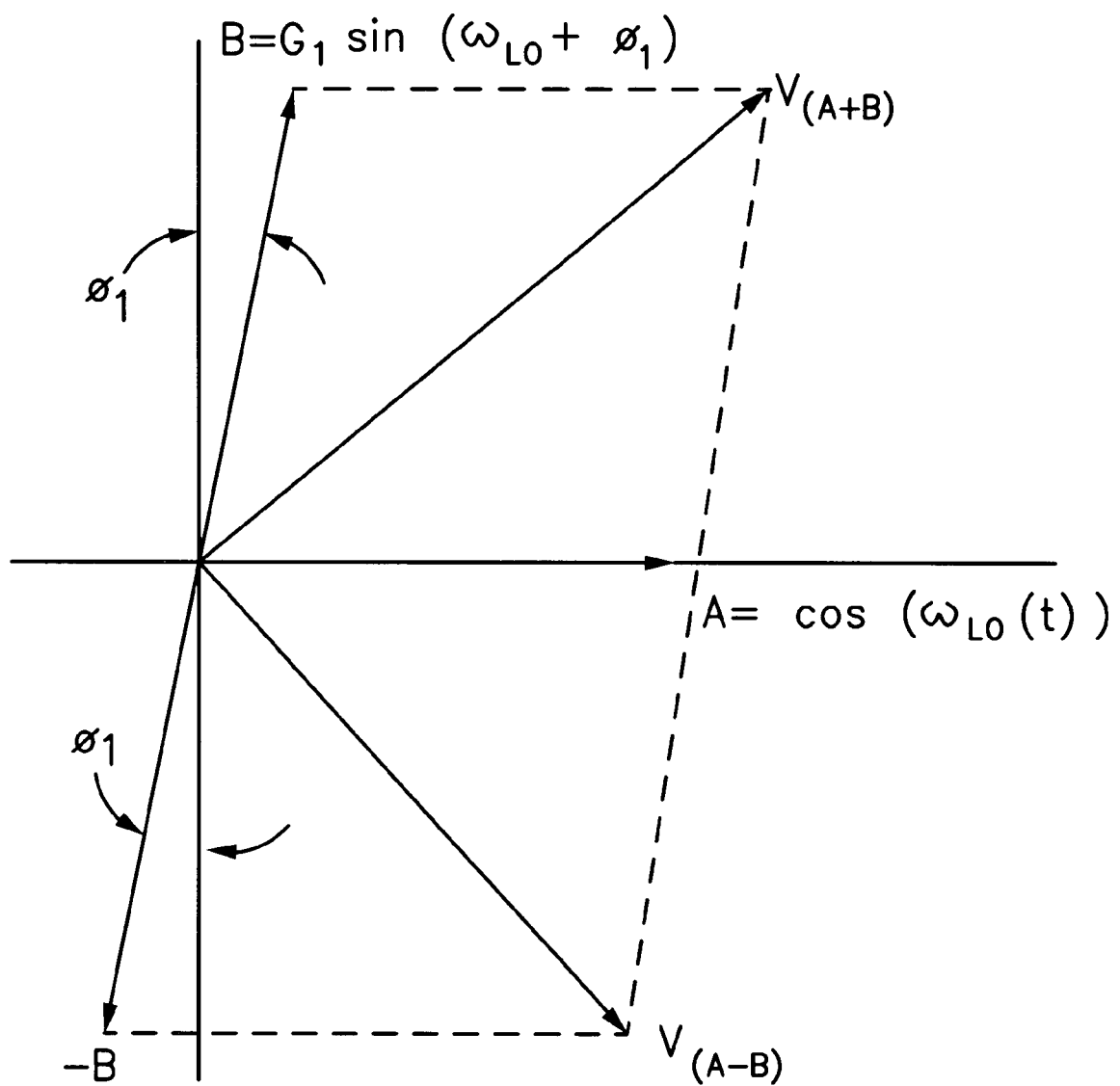

Referring to FIG. 4, to achieve channel quadrature balance, channel components $I_1$ and $Q_1$ are applied with equal values, $I_1=1$ and $Q_1=1$, with $G_1$ compensation applied to $Q_1$. The combined channel signal power ($P_1$) is measured with power detector 272, which is represented as vector $V_{(A+B)}$. Next, $Q_1$ is set to −1 and signal level ($P_2$) is measured with power detector 272, which is represented as vector $V_{(A-B)}$. The resolution quadrature phase imbalance can be determined from the following relation of power ratios:

$\sin \phi = 1 - P_1/P_2$

It is significant that the phase imbalance has been determined with the use of relative power measurements, which avoids the cost and complexity of phase measurements. The quadrature phase imbalance is compensated for by applying an additional term to the $I_1$ baseband inphase term. The compensated channel signal 226 (A+B) is accomplished with the preconditioning of $I_1$ and $Q_1$ with the following relation:

$A+B=(I_1-Q_1 \sin \phi_1) \cos (\omega_{LO}(t))+(G_1)^{-1}\sec\phi_1 Q_1 \cos (\omega_{LO}(t))$.

In a similar manner, the quadrature phase imbalance of channel signal 227 is determined and compensated for as follows:

$C+D=G[(I_2-Q_2 \sin \phi_2) \cos ((\omega_{LO}(t))+(G_2)^{-1}Q_2\sec\phi_2 \cos (\omega_{LO}(t))]$.

Figure 5:
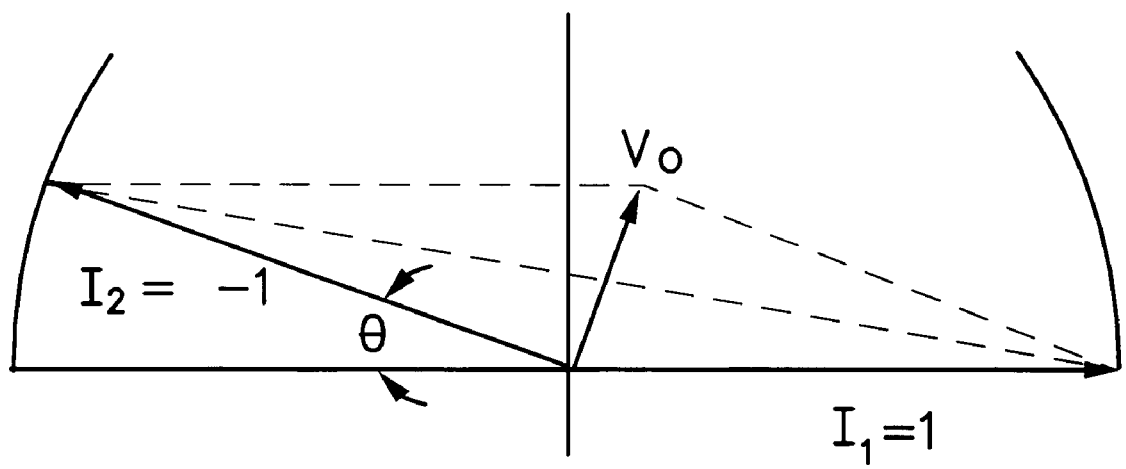
FIG. 5 is a graph showing the relationship between channel phase imbalance and the voltage output from a LINC amplifier, in accordance with the present invention.

Referring to FIG. 5, the inphase reference signal +$I_1$, for channel signal 226, and a vector opposite to $I_1$, the inphase reference signal (−$I_2$) 227 is used as channel signal for a test condition to determine the channel phase imbalance θ. Note that from the above equations, the baseband terms for this test condition are:

$I_1=1$, $I_2=-1$, $Q_1=0$, and $Q_2=0$;
$A+B=I_1\cos (\omega_{LO}(t))$; and $C+D=-G I_2\cos (\omega_{LO}(t))$.

Again a power ratio can be used to determine the channel phase imbalance term θ:

$\cos \theta = 1 - 2P_0/P_{ref}$;

where $P_0$ is the power measured at power detector 276 with $I_2=-1$ and $I_1=1$, and $P_{ref}$ is the power measured at power detector 276 with $I_1=1$ and $I_2=0$, or with $I_2=1$ and $I_1=0$. This power $P_0$ corresponds to the voltage vector $V_0$ in FIG. 5. The phase imbalance term θ is applied to compensate channel signal 245 relative to channel signal 235 with the following baseband relations:

$I_\theta = I_2 \cos \theta - Q_2 \sin \theta$;
$Q_\theta = I_2 \sin \theta + Q_2 \cos \theta$;

where $I_\theta$ and $Q_\theta$ represent channel phase with compensation taken into account. The sign of channel phase imbalance term can be determined by applying channel phase imbalance to the test condition of FIG. 5 and flipping the sign of θ to obtain a power at 276 of zero.

The resulting imbalance compensated baseband terms are as follows:

$$I_1' = I_1 - Q_1 \sin \phi_1$$
$$Q_2' = G_1^{-1} \sec \phi_1 Q_1$$
$$I_2' = G(I_\theta - Q_\theta \sin \theta_2)$$
$$= G[I_2 \cos \theta - Q_2 G_2 \sin \phi_2 \cos \theta - Q_2 G_2^{-1} \sec \phi_2 \sin \theta]$$
$$Q_2' = G(G_2^{-1} Q_\theta \sec \phi_2)$$
$$= G[I_2 \sin \theta - Q_2 G_2 \sin \phi_2 \sin \theta + Q_2 G_2^{-1} \sec \phi_2 \cos \theta]$$

where $I_1$, $Q_1$, $I_2$, and $Q_2$ are time varying values determined from a Cartesian translation of the input phase and amplitude modulated message signal 202, and $I_1'$, $Q_1'$, $I_2'$, $Q_2'$, are the compensated baseband signals outputted from the compensation module.

Some implementations may not have a provision within a LINC configuration where one channel can be turned off as described in the power setting test setup. Individual LINC channel powers can be set with both channels on by applying compensation terms $G_1$, $G_2$, $\phi_1$ and $\phi_2$ first from measurements at 272 and 274. With the test conditions of FIG. 5, the terms G and θ can be iterated for an output power measurement of zero at 276. Alternatively, G could be adjusted using power adjustments 262 and 264 at amplifiers 230 and 240. The power setting adjustments 262 and 264 are useful for the use of non-linear or compression operation amplifiers 230 and 240.

Figure 6:
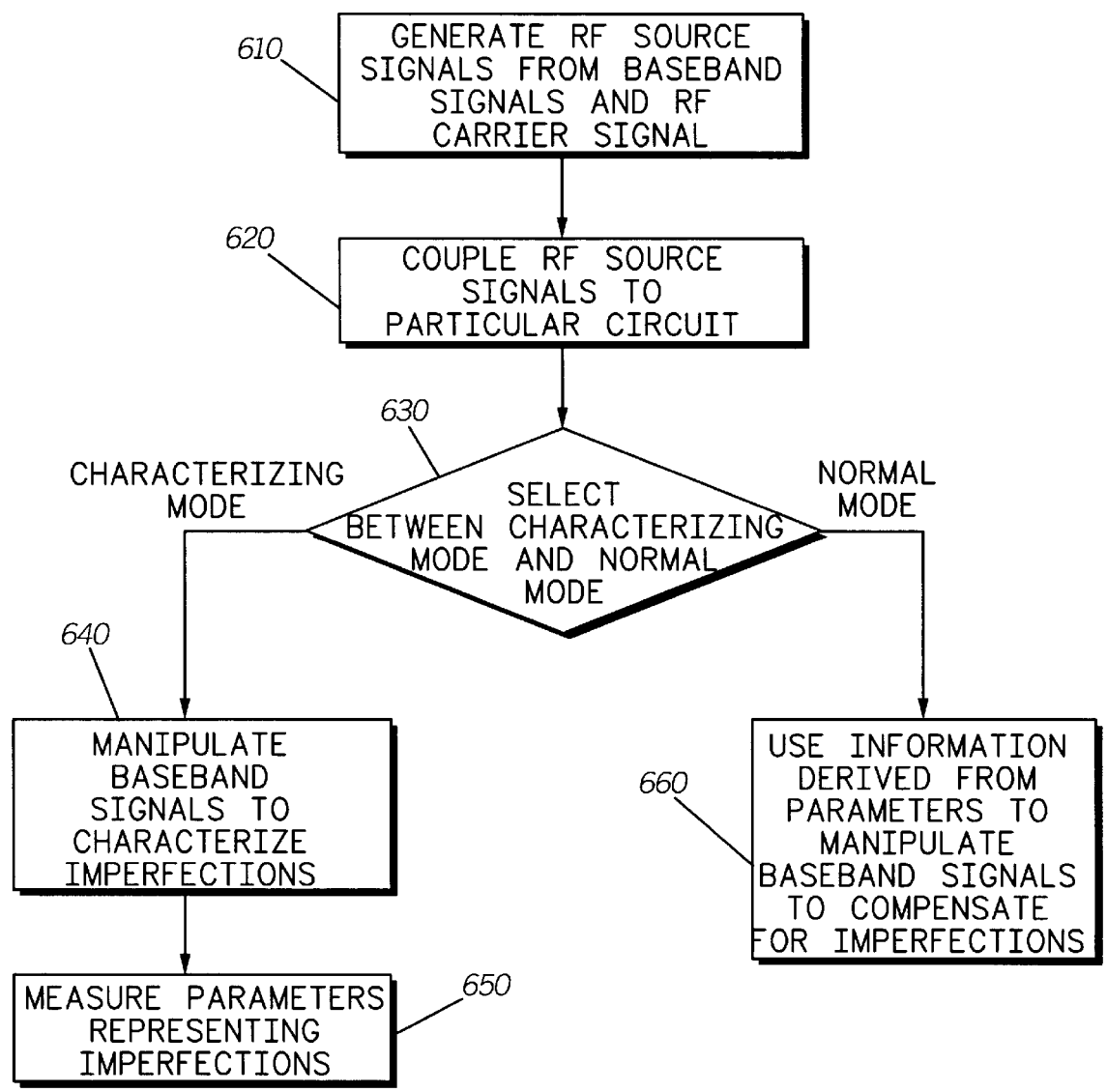
FIG. 6 is a summary of procedures to compensate for imperfections within a circuit, in accordance with the present invention.

FIG. 6 is a flowchart summarizing procedures for a compensated circuit apparatus that utilizes a compensated signal source to account for imperfections within a circuit. A signal source generates RF source signals that are coupled to a particular circuit to produce an output, steps 610, 620. Preferably, the RF source output signals are generated by modulating baseband signals onto RF carrier signals. In the preferred embodiment, the particular circuit is a LINC amplifier circuit having first and second amplification paths. The RF source outputs two constant envelope RF signals that have equal magnitude and offset phase relationships therebetween that represent an information signal. The two output signals are coupled to the first and second amplification paths and the resultant amplified signal summed to form an amplifier output signal.

The compensated circuit apparatus is operable in a characterizing mode and in a normal mode. The characterizing mode is used to determine circuit compensation parameters which are applied during the normal mode. Thus, the apparatus selects between the characterizing mode and the normal mode, step 630. When in the characterizing mode, baseband signals are modulated in a manner such that a training configuration or predetermined test condition is applied to highlight imperfections with the signal source and within the particular circuit, step 640. While the training configuration is being applied, at least some of the parameters are measured at the outputs from the RF source, and preferably at least one parameter is measured at the output of the particular circuit, step 650. These parameters are used to develop an error model representing the imperfections. In the preferred embodiment, the circuit imperfections tend to be related to amplitude and phase signal processing. Consequently, power level is measured at the input to the amplification circuit and at the output of the combiners and amplitude and phase correction values are derived from the power level measurements. Once developed, the compensation values tend to be fixed for a given circuit configuration and operating condition.

When the compensated circuit apparatus selects the normal operating mode, step 630, information derived from the parameters is used to manipulate baseband signals to compensate for circuit imperfections, step 660. Compensation is applied when generating RF source output signals by modification of amplitude of the baseband signals. In the preferred embodiment, the compensation information is selectively applied to adjust gain in one or more of the amplification circuits to balance gain in the two amplification paths.

Figure 7:
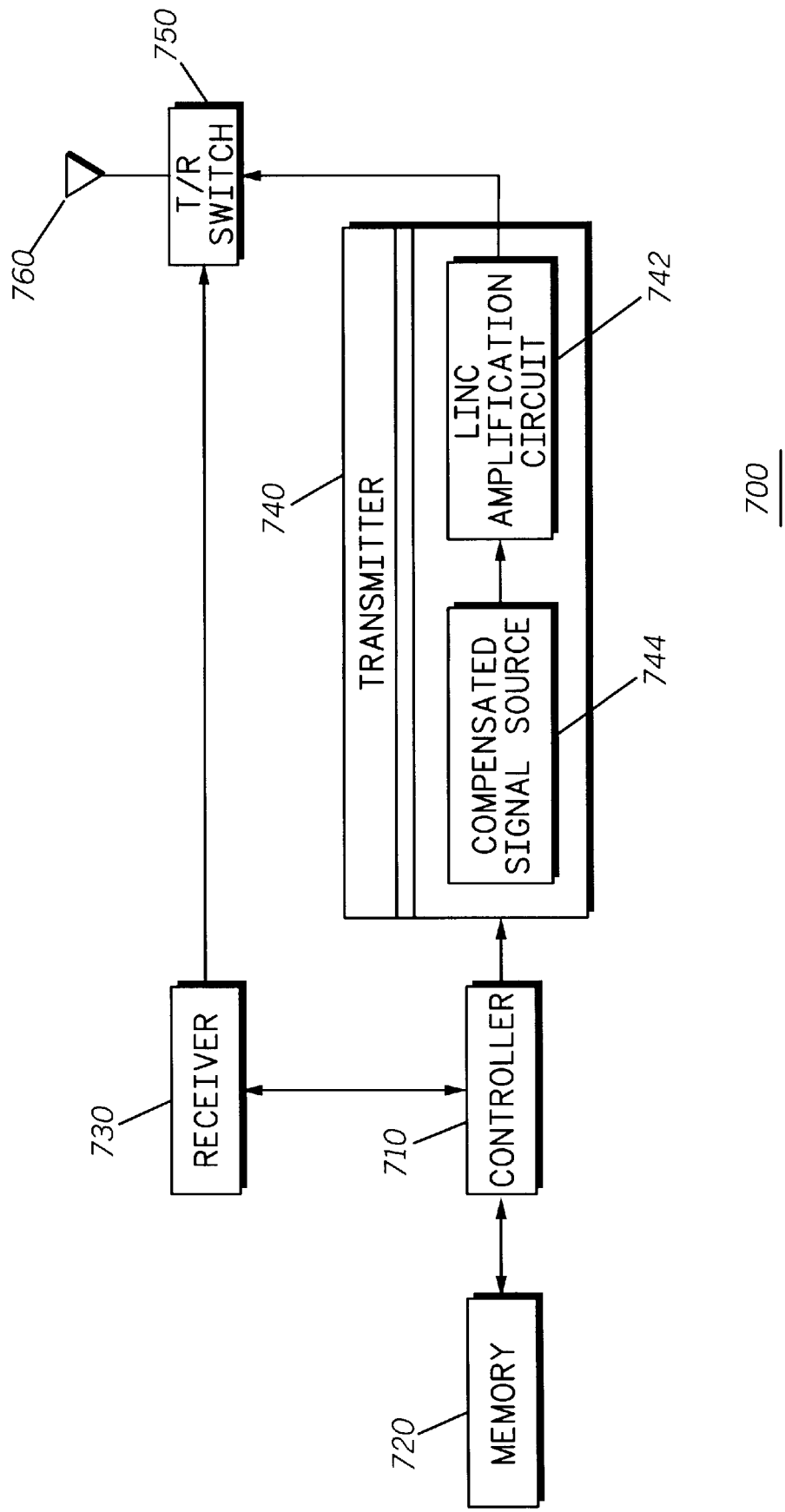
FIG. 7 is a block diagram of a radio communication device employing a LINC amplification circuit with a compensated signal source, in accordance with the present invention.

FIG. 7 is a block diagram of a communication device 700, in accordance with the present invention. The communication device 700 is a portable two-way radio having communication circuitry 730, 740 for communicating over radio frequency channels. The radio includes as coupled components, a receiver 730, a transmitter 740, a controller 710, and memory 720, a transmit/receive switch 750, and an antenna 760. The transmitter 740 utilizes a LINC amplifier 742, 744 including amplification circuit 742 with a compensated signal source 744, formed according to the present invention.

The operation of the radio is governed by the controller 710 under instructions stored in the coupled memory 720 to perform receive and transmit operations. For receive operations, the transmit/receive switch 750 is engaged to selectively couple the antenna 760 to the receiver 730. For transmit operations, the transmit/receive switch 750 is engaged to couple the transmitter 740 to the transmit/receive switch. The controller 710 operates the transmitter to select between a characterizing and a normal operating mode for the LINC amplifier 742, 744. When in the configuration mode, the compensated signal source and amplification circuit are characterized to determine circuit imperfections within the LINC amplifier 742, 744. When in the normal mode, information derived from the characterization of circuit imperfections is applied when processing signals to be transmitted.

The present invention offers significant advantages over the prior art. The compensation methodology described can be used to accommodate differences in circuits due to component imperfections and operating environment which can lead to unwanted variations in signal processing. Thus, an application requiring the maintenance of a precise relationship between signals processed in different portions of a circuit, such a LINC amplifier, can be realized. A variety of other applications are contemplated as well. The circuit 140 of FIG. 1 may constitute a Doherty amplifier or circuit measurement and characterization equipment, for example. In such applications, an error model can be developed using an analysis similar to that described above. A significant aspect of the present invention is the ability to develop phase compensation adjustments without the need for direct phase measurements. In the preferred embodiment, phase adjustments are made using only power measurements in an open loop configuration, thereby avoiding the complexity and instability issues of prior art approaches.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method utilizing a signal source having a plurality of signal outputs coupled to particular circuit and provide inputs thereto, the particular circuit having an output, the method comprising the steps of:

applying a training configuration to the signal source to highlight imperfections within the signal source and within the particular circuit;

measuring parameters, during application of the training configuration, to develop an error model representing the imperfections in the signal source and in the particular circuit, wherein at least some of the parameters are measured at the plurality of signal outputs, and wherein at least one of the parameters is measured at the output of the particular circuit; and applying compensation to the signal source based on the parameters, which compensation affects the plurality of signal outputs and compensates for the imperfections in the signal source and in the particular circuit;

wherein:

the imperfections are related to amplitude and phase imbalance among at least two of the plurality of signal outputs; and the step of measuring parameters further comprises the step of measuring power level at the plurality of signal outputs from the signal source, and at the output of the particular circuit, to determine the parameters.

2. The method of claim 1, wherein the step of applying compensation further comprises the step of deriving amplitude and phase correction values derived from the power level measurements.

3. The method of claim 1, wherein the signal source has a plurality of baseband signal inputs, and a radio frequency (RF) signal input, that are combined to generate the plurality of signal outputs, and the step of applying a training configuration comprises the step of manipulating the baseband signal inputs to generate predefined test conditions.

4. The method of claim 3, wherein the step of applying compensation comprises the step of modifying the plurality of baseband signal inputs according to parameters measured during application of the training configuration.

5. The method of claim 4, wherein the particular circuit is an amplification circuit.

6. The method of claim 4, wherein the particular circuit comprises a linear amplification with non-linear components (LINC) amplifier having first and second amplification paths coupled to first and second signal outputs of the plurality of signal outputs, and the step of applying compensation comprises the step of modifying the plurality of baseband signal inputs to balance amplitude and phase for signals traversing the first and second amplification paths.

7. The method of claim 6, wherein the LINC amplifier has a combining juncture having an output of a combination of the first and second amplification paths, and the step of measuring parameters comprises the step of measuring power level at the output of the combining juncture to adjust amplitude and phase components of signals sourced from the first and second signal outputs of the plurality of signal outputs.

8. The method of claim 6, wherein the step of applying compensation further comprises the step of adjusting gain within at least one of the first and second amplification paths.

9. A method, comprising the steps of:
generating a plurality of radio frequency (RF) signals from a signal source by modulating a RF carrier signal with baseband signals;
coupling the plurality of RF signals to a particular circuit to generate an output;
alternatively operating the signal source in a characterizing mode and in a normal mode;
when in the characterizing mode:
characterizing imperfections within the particular circuit and within the signal source through manipulation of the baseband signals according to a predefined configuration;
measuring the plurality of radio frequency (RF) signals and the output of the particular circuit to develop parameters representing the imperfections within the particular circuit; and
when in the normal mode, manipulating the baseband signals based on information derived from the parameters to compensate for the imperfections within the particular circuit.

10. The method of claim 9, wherein the particular circuit comprises an amplification circuit.

11. The method of claim 10, further comprising the step of, when in the normal mode, adjusting gain in the amplification circuit based on information derived from the parameters.

12. The method of claim 10, wherein the amplification circuit comprises a linear amplification with non-linear components (LINC) amplifier having first and second amplification paths coupled to first and second RF signals of the plurality of RF signals.

13. The method of claim 12, wherein the step of characterizing imperfections further comprises the step of generating data characterizing amplitude and phase imbalances between the first and second amplification paths.

14. The method of claim 12, wherein the step of measuring further comprises the steps of:
measuring signal power levels at the plurality of RF signals and at the output of the particular circuit; and
deriving amplitude and phase compensation values from the measured signal power levels.

15. An apparatus operable in a characterizing mode and in a normal mode, comprising:
a signal source having as inputs a plurality of baseband signals and a radio frequency (RF) carrier signal, and having as outputs first and second source signals derived from a combination of the plurality of baseband signals and the RF carrier signal;
a particular circuit having as inputs the first and second source signals and having an output signal;
wherein when operating in the characterizing mode, the apparatus:
characterizes imperfections within the particular circuit and within the signal source through manipulation of the plurality of baseband signals according to a predefined configuration; and
measures the first and second source signals and the output signal to develop parameters representing the imperfections within the particular circuit; and
wherein when operating in the normal mode, the apparatus manipulates the plurality of baseband signals based on information derived from the parameters to compensate for the imperfections within the particular circuit.

16. The apparatus of claim 15, wherein the particular circuit comprises an amplification circuit.

17. The apparatus of claim 16, further comprising a gain adjuster coupled to the amplification circuit, wherein when operating in the normal mode, the apparatus manipulates the gain adjuster based on information derived from the parameters to compensate for the imperfections within the particular circuit.

18. The apparatus of claim 17, wherein the amplification circuit comprises a linear amplification with non-linear components (LINC) amplifier having first and second amplification paths coupled to first and second source signals.

19. The apparatus of claim 18, wherein the imperfections comprises amplitude and phase imbalances between the first and second amplification paths.

20. The apparatus of claim 15, further comprising:
first and second power detectors coupled to the first and second source signals, respectively; and
a third power detector coupled to the output signal of the particular circuit;
wherein the apparatus measures signal power levels using the first, second, and third power detectors, and derives amplitude and phase compensation values therefrom.

21. The apparatus of claim 20, wherein the particular circuit is an open loop circuit.

22. A linear amplification with non-linear components (LINC) amplifier responsive to an input information signal to output an amplified version of the input information signal, comprising:
a constant envelope signal generation circuit responsive to a plurality of baseband signals and a radio frequency (RF) carrier signal to provide as output first and second source signals, the constant envelope signal generation circuit being alternatively operable in a characterizing mode and in a normal mode;
a first amplification circuit coupled to the first source signal and responsive thereto to provide as output a first amplified signal;
a second amplification circuit coupled to the second source signal and responsive thereto to provide as output a second amplified signal;
a combining circuit coupled to the first and second amplified signals and responsive thereto to provide an output of the amplified version of the input information signal;
a first power detector coupled to the first source signal;
a second power detector coupled to the second source signal; and
a third power detector coupled to the output of the combining circuit;
wherein when operating in the characterizing mode, the constant envelope signal generation circuit:
characterizes imperfections within the first and second amplification circuits through manipulation of the plurality of baseband signals according to a predefined configuration; and
measures the first and second source signals and the output of the combining circuit using the first, second, and third power detectors to develop parameters representing the imperfections within the first and second amplification circuits; and wherein when operating in the normal mode, the constant envelope signal generation circuit manipulates the plurality of baseband signals based on information derived from the parameters to compensate for the imperfections within the first and second amplification circuits.

23. The LINC amplifier of claim 22, further comprising first and second gain adjusters coupled to the first and second amplification circuits, respectively, and responsive to adjust gain therein based on information derived from the parameters.

24. A radio, comprising:

communication circuitry; and a transmitter coupled to the communication circuitry, the transmitter including a LINC amplifier comprising:

a signal source having as inputs a plurality of baseband signals and a radio frequency (RF) carrier signal, and having as outputs first and second source signals derived from a combination of the plurality of baseband signals and the RF carrier signal;

amplification circuitry having as inputs the first and second source signals and having an output signal;

wherein the LINC amplifier is operable in a first mode to:

characterize imperfections within the amplification circuitry and within the signal source through manipulation of the plurality of baseband signals according to a predefined configuration; and measure the first and second source signals and the output signal to develop parameters representing the imperfections within the amplification circuitry; and wherein the LINC amplifier is operable in a second mode to manipulate the plurality of baseband signals based on information derived from the parameters to compensate for the imperfections within the amplification circuitry.

25. The radio of claim 24, wherein the amplification circuitry further comprises first and second amplification paths, respectively, and the parameters developed relate to phase and amplitude imbalance between the first and second amplification paths.

* * * * *